US012720752B2

(12) United States Patent
Song et al.

(10) Patent No.: US 12,720,752 B2
(45) Date of Patent: Aug. 25, 2026

(54) THREE DIMENSIONAL FLASH MEMORY WITH BULK ERASING

(71) Applicant: IUCF-HYU (INDUSTRY-UNIVERSITY COOPERATION FOUNDATION HANYANG UNIVERSITY), Seoul (KR)

(72) Inventors: Yun Heub Song, Seoul (KR); Bongseok Kim, Seoul (KR); Inho Nam, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 838 days.

(21) Appl. No.: 17/927,559

(22) PCT Filed: May 4, 2021

(86) PCT No.: PCT/KR2021/005617

§ 371 (c)(1),
(2) Date: Apr. 6, 2023

(87) PCT Pub. No.: WO2021/241903

PCT Pub. Date: Dec. 2, 2021

(65) Prior Publication Data

US 2023/0301110 A1 Sep. 21, 2023

(30) Foreign Application Priority Data

May 25, 2020 (KR) ........................ 10-2020-0062328
May 25, 2020 (KR) ........................ 10-2020-0062329
May 25, 2020 (KR) ........................ 10-2020-0062330

(51) Int. Cl.
*H10B 43/40* (2023.01)
*G11C 16/04* (2006.01)
(Continued)

(52) U.S. Cl.
CPC ......... *H10B 43/40* (2023.02); *G11C 16/0483* (2013.01); *G11C 16/08* (2013.01);
(Continued)

(58) Field of Classification Search
CPC . H01L 27/1027; H01L 27/1028; H10B 53/00; H10B 53/10; H10B 53/20;
(Continued)

(56) References Cited

U.S. PATENT DOCUMENTS 9,953,992 B1 * 4/2018 Ogawa ................... H10B 43/27
2016/0043100 A1 * 2/2016 Lee ...................... H01L 23/535
257/324

(Continued)

FOREIGN PATENT DOCUMENTS

KR 10-2014-0028969 A 3/2014
KR 10-2016-0000512 A 1/2016
(Continued)

OTHER PUBLICATIONS

International Search Report for PCT/KR2021/005617, dated Aug. 26, 2021.

*Primary Examiner* — William B Partridge
*Assistant Examiner* — Gustavo G Ramallo
(74) *Attorney, Agent, or Firm* — Sughrue Mion, PLLC

(57) ABSTRACT

A three-dimensional flash memory for promoting integration, and a manufacturing method therefor are disclosed. The three-dimensional flash memory to which a cell on peripheral circuit (COP) structure is applied comprises: a substrate having at least one transistor of a peripheral circuit, formed according to the COP structure; at least one memory
(Continued)

cell string formed to extend in one direction above the at least one transistor; and a common source line commonly used by means of the at least one transistor and the at least one memory cell string.

15 Claims, 17 Drawing Sheets

(51) Int. Cl.

| | |
|---|---|
| ***G11C 16/08*** | (2006.01) |
| ***H10B 41/10*** | (2023.01) |
| ***H10B 41/27*** | (2023.01) |
| ***H10B 41/35*** | (2023.01) |
| ***H10B 41/41*** | (2023.01) |
| ***H10B 43/10*** | (2023.01) |
| ***H10B 43/27*** | (2023.01) |
| ***H10B 43/35*** | (2023.01) |

(52) U.S. Cl.
CPC ............ *H10B 41/10* (2023.02); *H10B 41/27* (2023.02); *H10B 41/35* (2023.02); *H10B 41/41* (2023.02); *H10B 43/10* (2023.02); *H10B 43/27* (2023.02); *H10B 43/35* (2023.02)

(58) Field of Classification Search
CPC ........ H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 2016/0118399 | A1* | 4/2016 | Son ........................ | H10B 43/40<br>257/314 |
| 2019/0157284 | A1* | 5/2019 | Park ....................... | H10B 43/10 |

FOREIGN PATENT DOCUMENTS

| | | | |
|---|---|---|---|
| KR | 10-2017-0061247 | A | 6/2017 |
| KR | 10-2019-0051694 | A | 5/2019 |
| KR | 10-2020-0024630 | A | 3/2020 |

* cited by examiner

Figure 5:
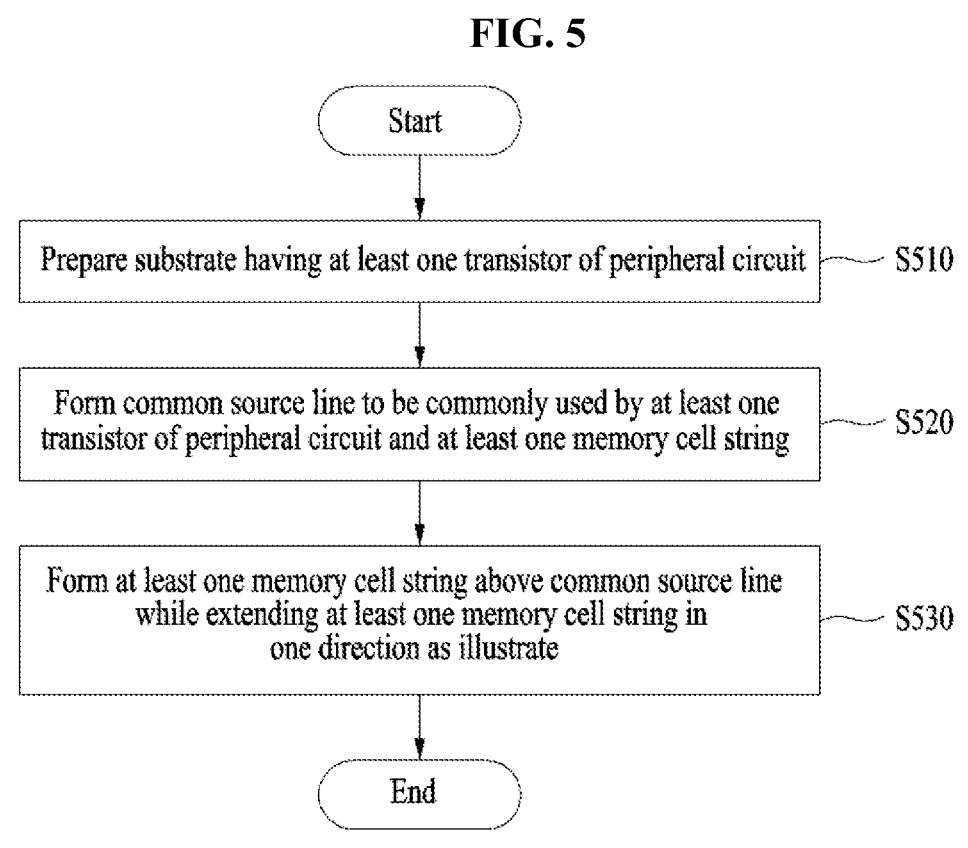

Start

Prepare substrate having at least one transistor of peripheral circuit — S510

Form common source line to be commonly used by at least one transistor of peripheral circuit and at least one memory cell string — S520

Form at least one memory cell string above common source line while extending at least one memory cell string in one direction as illustrate — S530

End

FIG. 10

THREE DIMENSIONAL FLASH MEMORY WITH BULK ERASING

CROSS REFERENCE TO RELATED APPLICATIONS

This application is a National Stage of International Application No. PCT/KR2021/005617 filed on May 4, 2021, claiming priority based on Korean Patent Application No. 10-2020-0062328 filed on May 25, 2020, Korean Patent Application No. 10-2020-0062329 filed on May 25, 2020, and Korean Patent Application No. 10-2020-0062330 filed on May 25, 2020.

TECHNICAL FIELD

Following embodiments relates to a three-dimensional (3D) flash memory, and more particularly, relates to a 3D flash memory and a method for manufacturing the same.

BACKGROUND ART

A flash memory, which is an Electrically Erasable Programmable Read Only Memory (EEPROM), electrically controls the input/output of data through Fowler-Nordheim-tunneling or Hot electron injection.

Recently, a 3D structure has been employed for the flash memory to increase the integration by vertically stacking cells such that the excellent performance and the lower price required by a consumer are satisfied. Referring to FIG. 1 illustrating the conventional 3D flash memory, a 3D flash memory 100 has a structure including a channel layer 121 formed on a substrate 110 in a vertical direction, a charge storage layer 122 formed to surround the channel layer 121, a plurality of electrodes connected to the charge storage layer 122 and stacked in a horizontal direction, and a plurality of insulating layers 140 alternately interposed between the plurality of electrode layers 130. Hereinafter, the charge storage layer 122 and the channel layer 121, which are components directly related to storing and reading data, may be named a memory cell string 120.

The 3D flash memory 100 may have a COP structure in which at least one transistor 150 of a peripheral circuit is formed on the substrate 110 and the insulating layer 151 is disposed thereon, such that the at least one transistor 150 of the peripheral circuit is buried in the substrate 110 and the insulating layer 151. Hereinafter, the peripheral circuit refers to a circuit remaining operations of the operations of the 3D flash memory 100 other than the operations of storing and reading data in the memory cell string.

However, according to the conventional 3D flash memory 100 employing the COP structure, a source line 123 employed for at least one memory cell string 120 is independently distinguished from source lines 152 and 153 employed for the at least one transistor 150 of the peripheral circuit. Accordingly, the source line 123 for the memory cell string and the source lines 152 and 153 for the transistor of the peripheral circuit are manufactured through mutually different processes. Accordingly, the manufacturing costs may be increased, a design for Layout is complex, and an area may not be effectively used in the designing of the Layout.

Accordingly, there is required a technology of reducing the manufacturing cost, simplifying the Layout design, and effectively using an area in the designing of the layout, when manufacturing the source line for the memory cell string and the source lines for transistors of the peripheral circuit.

In addition, according to the 3D flash memory 100 employing the COP structure, the memory cell string 120 is separated from the substrate 110 and isolated from the substrate 110, by the insulating layer 151 to cover the at least one transistor 150. Accordingly, even though a bulk erasing voltage is applied to the substrate 110, the bulk erasing operation is not supported.

Accordingly, there needs to be suggested a technology for supporting the bulk erasing operation.

In addition, referring to FIG. 2, which is an X-Y plan view illustrating the conventional 3D flash memory, and FIG. 3, which is an X-Y cross-sectional view taken along axis A-A' illustrated in FIG. 2, a 3D flash memory 200 may include a first memory cell array 205, a second memory cell array 235, a row decoder 260, and two column decoders 270 and 280 (provided to correspond to memory cell arrays 205 and 235 included in the 3D flash memory 200), and the 3D structure may be applied to the first memory cell array 205 and the second memory cell array 235. Hereinafter, although the row decoder 260 is positioned on a step part 223 of the first memory cell array 205 and a step part 253 of the second memory cell array 235, the row decoder 260 is marked in a dotted line as illustrated in FIG. 2, for the illustrative purpose.

In more detail, the first memory cell array 205 may be configured to include at least one first memory cell string 210 extending in a vertical direction (a Z direction), and a plurality of first wordlines 220 connected to the at least one first memory cell string 210 perpendicularly to the first memory cell string 210 and stacked while extending in a horizontal direction (an X direction). The second memory cell array 235 may be configured to include at least one second memory cell string 240 formed to extend in a vertical direction (the Z direction), and a plurality of second wordlines 250 connected to at least one second memory cell string 240 perpendicularly to the at least one second memory cell string 240 and stacked while extending in the horizontal direction (the X direction).

In this case, each of the at least one first memory cell string 210 and the at least one second memory cell string 240 may include at least one channel layer 211 or 241 extending in the vertical direction (the Z direction) and at least one charge storage layer 212 or 242 formed to surround the at least one channel layer 211 and 241. A plurality of first wordlines 225 may be alternately interposed between the plurality of first wordlines 220, and a plurality of second insulating layers (not illustrated) may be alternately interposed between the plurality of second wordlines 250.

In this case, a contact 221-1 has to be formed in each of the wordlines 221 and 222 constituting the first wordlines 220 to be connected to control lines 260 of the row decoder 260, and a contact 251-1 has to be formed in each of the wordlines 251 and 252 constituting the second wordlines 250 to be connected to control lines 260 of the row decoder 260. Accordingly, the first wordlines 220 and the second wordlines 250 form the shape of a step, when viewed from a side view, including the step parts 223 and 225 and the plan parts 224 and 254, as illustrated in the drawing.

As described above, the conventional 3D flash memory 200 has a lower integration, because the step part 223 of the first wordlines 220 and the step part 253 of the second wordlines 250 occupy larger proportions of an entire memory area as illustrated in the drawing.

Furthermore, the control lines 261 of the low decoder 260 have to be provided in number corresponding to the number of contacts 221-1 of the first memory cell array 205 and the number of contacts 251-1 of the second memory cell array 235, such that the first memory cell array 205 and the second memory cell array 205 are connected to each other. Accordingly, the complex is increased in a metal interconnection process and the process costs are increased.

Accordingly, there needs to be suggested a technology for overcoming disadvantages of the conventional 3D flash memory 200.

DETAILED DESCRIPTION OF THE INVENTION

Technical Problem

Embodiments suggest a 3D flash memory employing a COP structure employing a common source line for a memory cell string and a transistor of a peripheral circuit and a method for manufacturing the same.

In more detail, embodiments suggest a 3D flash memory including a common source line commonly used by at least one transistor of a peripheral circuit and at least one memory string, thereby reducing the manufacturing costs, simplifying a Layout design, and effectively using an area in the Layout design, and a method for manufacturing the same.

Embodiments suggest a 3D flash memory employing a COP structure to support a bulk erasing operation and a method for manufacturing the same.

In more detail, embodiments suggest a 3D flash memory employing a COP structure to support a bulk erasing operation by including a connecting part to connect a substrate to at least one memory cell string, and a method for manufacturing the same.

Embodiments suggest 3D flash memory and a method for manufacturing the same, in which wordline control lines of the row decoder simultaneously share the first memory cell array and the second memory cell array through mutually different contacts. Accordingly, the area of the step part of each memory cell array is reduced to achieve the integration, the number of wordline control lines of the row decoder connected to the contact of the memory cell arrays is reduced to simplify the metal interconnection process, and the process costs are reduced.

Technical Solution

According to an embodiment, a 3D flash memory employing a COP structure includes a substrate having at least one transistor of a peripheral circuit formed based on the COP structure, at least one memory cell string extending in one direction form an upper portion of the at least one transistor, and a common source line commonly used by the at least one transistor and the at least one memory device.

According to one aspect, the common source line may include at least one horizontal part and at least one vertical part to be commonly used by the at least one transistor and the at least one memory string.

According to another aspect, the common source line may include the at least one horizontal part and the at least one vertical part integrally formed through a single process.

According to still another aspect, the at least one horizontal part and the at least one vertical part may include the same material.

According to still another aspect, the at least one horizontal part may be connected to the at least one memory cell string, and the at least one vertical part may be connected to the at least one transistor.

According to an embodiment, the 3D flash memory employing the COP structure may include a substrate having at least one transistor of a peripheral circuit formed based on the COP structure, at least one memory cell string extending in one direction form an upper portion of the at least one transistor, and a connection part to connect the substrate to the at least one memory cell string.

According to an embodiment, the connection part may perform a function of transmitting a bulk erasing voltage, which is applied to the substrate, to the at least one memory cell string.

According to another embodiment, the connection part may include at least one horizontal part positioned in parallel to the substrate, between an upper portion of the at least one transistor and a lower portion of the at least one memory cell string, and at least one vertical part positioned perpendicularly to the substrate, in a space in the at least one transistor.

According to still another embodiment, the connection part may include the at least one horizontal part and the at least one vertical part integrally formed through an epitaxial growing process.

According to still another embodiment, the at least one horizontal part may be formed to have an area corresponding to an area for the at least one memory cell string and an area for the at least one transistor.

According to an embodiment, a 3D flash memory for integration, includes a first memory cell array including at least one first memory cell string extending in a vertical direction and a plurality of first wordlines connected to the at least one first memory cell string perpendicularly to the at least one first memory cell string and stacked while extending in a horizontal direction, in which the first wordlines extend with mutually different lengths and include step part and plan parts, a second memory cell array including at least one second memory cell string extending in the vertical direction and a plurality of second wordlines connected to the at least one second memory cell string perpendicularly to the at least one second memory cell string and stacked while extending in the horizontal direction, in which the second wordlines extend with mutually different lengths and include a step part and a plan part, and a row decoder formed between the first memory cell array and the second memory cell array. Each of wordline control lines of the row decoder simultaneously share the first memory cell array and the second memory cell array through mutually different contacts.

According to an aspect, each of the wordline control lines of the row decoder is connected with a contact of one step of steps constituting the step part of the first wordlines and a contact of one step of steps constituting the step part of the second wordlines.

According to another aspect, the step part of the first wordlines and the step part of the second wordlines are disposed to be adjacent to each other in a rotational symmetry, while forming a triangular shape when viewed in a plan view.

According to still another aspect, the step part of the first wordlines and the step part of the second wordlines are adjacent to each other in a rotational symmetry to form a rectangular shape.

According to still another aspect, the step part of the first wordlines and the step part of the second wordlines are positioned under the row decoder.

Advantageous Effects of the Invention

Embodiments may suggest a 3D flash memory employing a COP structure including a common source line for a memory cell string and a transistor for a peripheral circuit.

In more detail, embodiments suggest a 3D flash memory including a common source line commonly used by at least one transistor of a peripheral circuit and at least one memory string, thereby reducing the manufacturing costs, simplifying a Layout design, and effectively using an area in the Layout design, and a method for manufacturing the same.

Embodiments may suggest a 3D flash memory employing a COP structure to support a bulk erasing operation and a method for manufacturing the same.

In more detail, embodiments may suggest a 3D flash memory employing a COP structure to support a bulk erasing operation by including a connecting part to connect a substrate to at least one memory cell string, and a method for manufacturing the same.

Embodiments may suggest a 3D flash memory in which the wordline control lines of the row decoder may be configured to simultaneously share the first memory cell array and the second memory cell array through mutually different contacts, the integration may be achieved by reducing the area of the step part of each of the memory cell arrays, and the number of the wordline control lines of the low decoder connected to the contacts of the memory cell arrays is reduced to simplify the metal interconnection process and to reduce the process costs, and a method for manufacturing the same.

DESCRIPTION OF THE DRAWINGS

Figure 2:
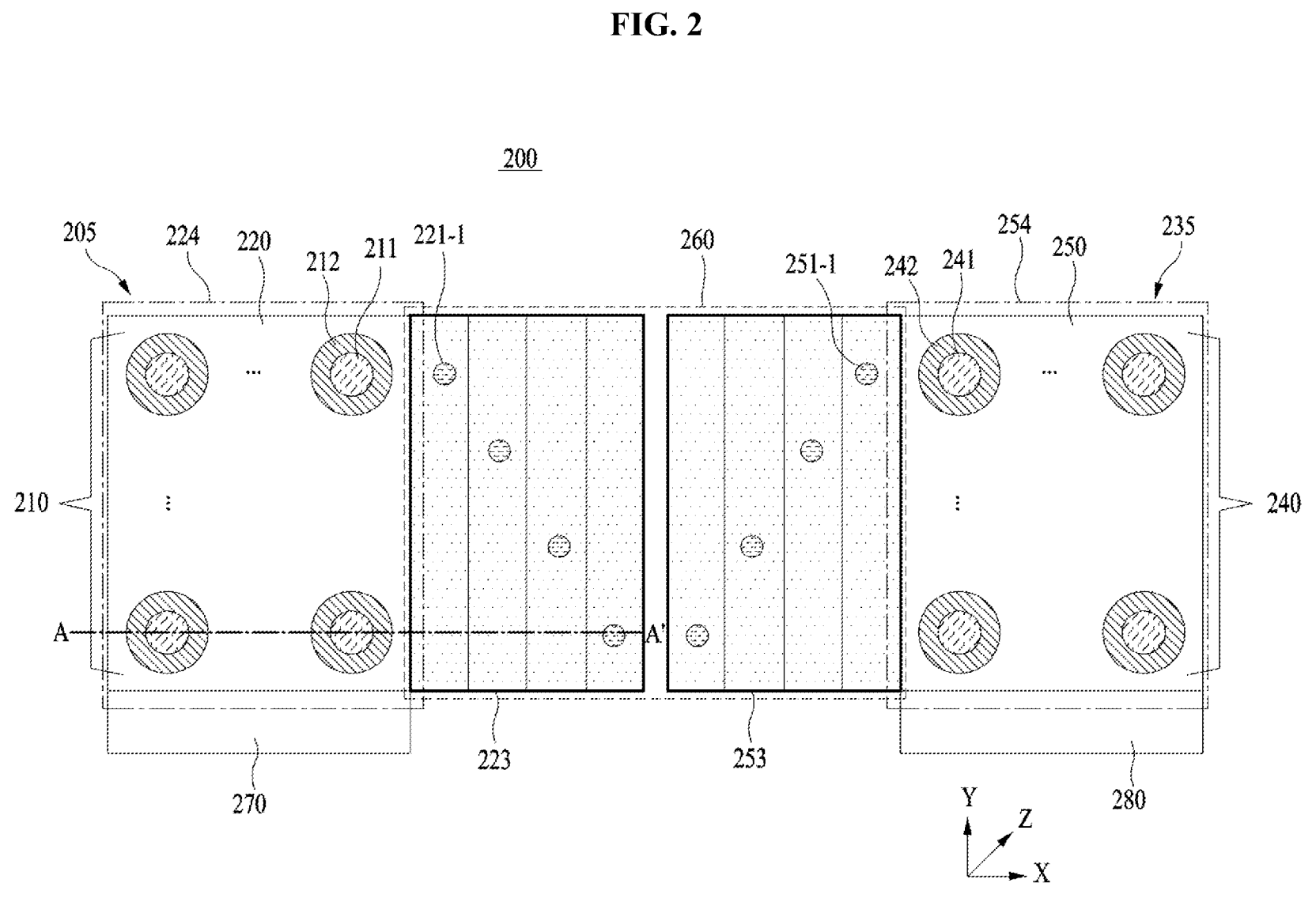

FIG. 2 is an X-Y plan view illustrating a conventional 3D flash memory.

FIG. 5 is a flowchart illustrating a method for manufacturing a 3D flash memory according to an embodiment.

FIG. 10 is an X-Z cross sectional view illustrating a conventional 3D flash memory according to an embodiment.

BEST MODE

Figure 1:
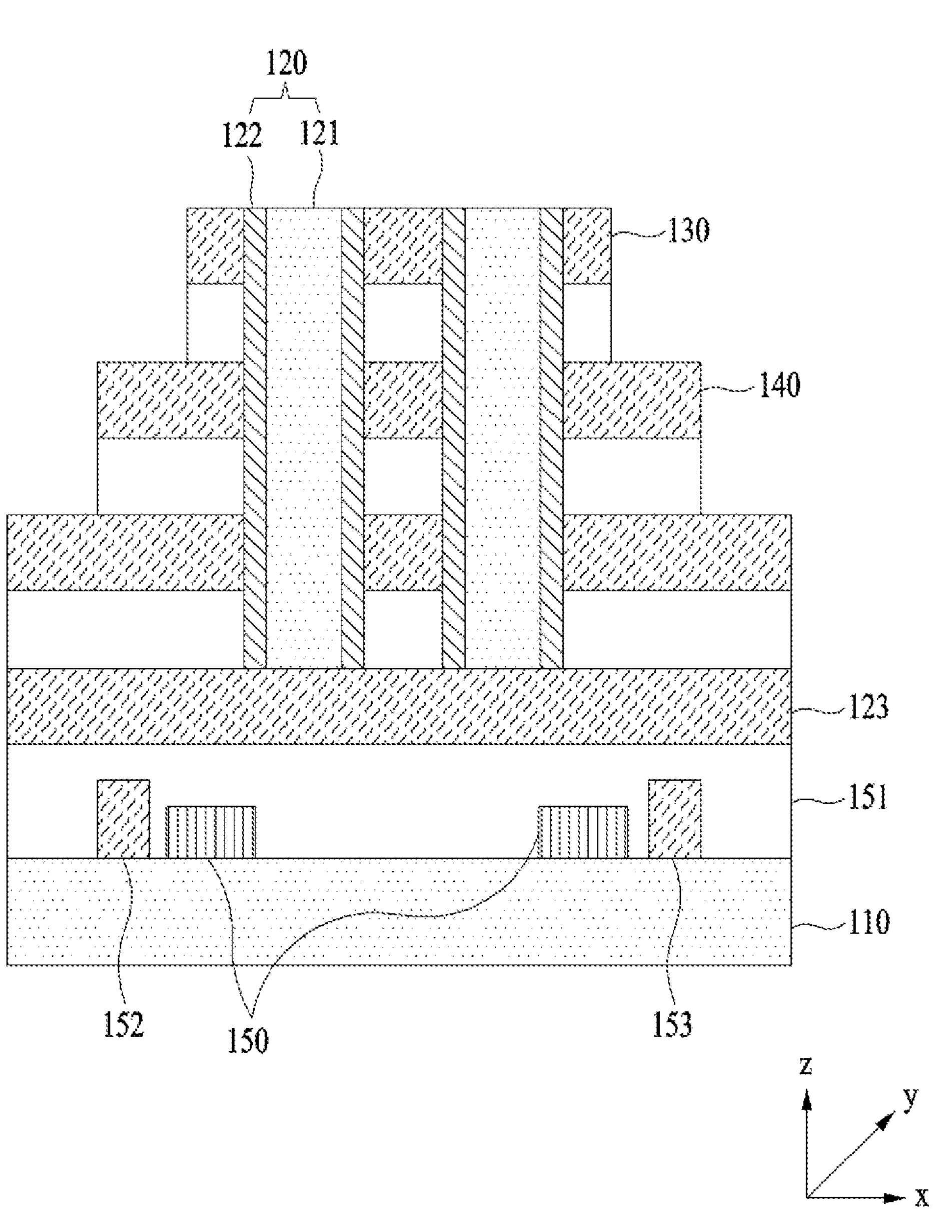
FIG. 1 is an X-Z cross-sectional view illustrating a conventional 3D flash memory.
Figure 3:
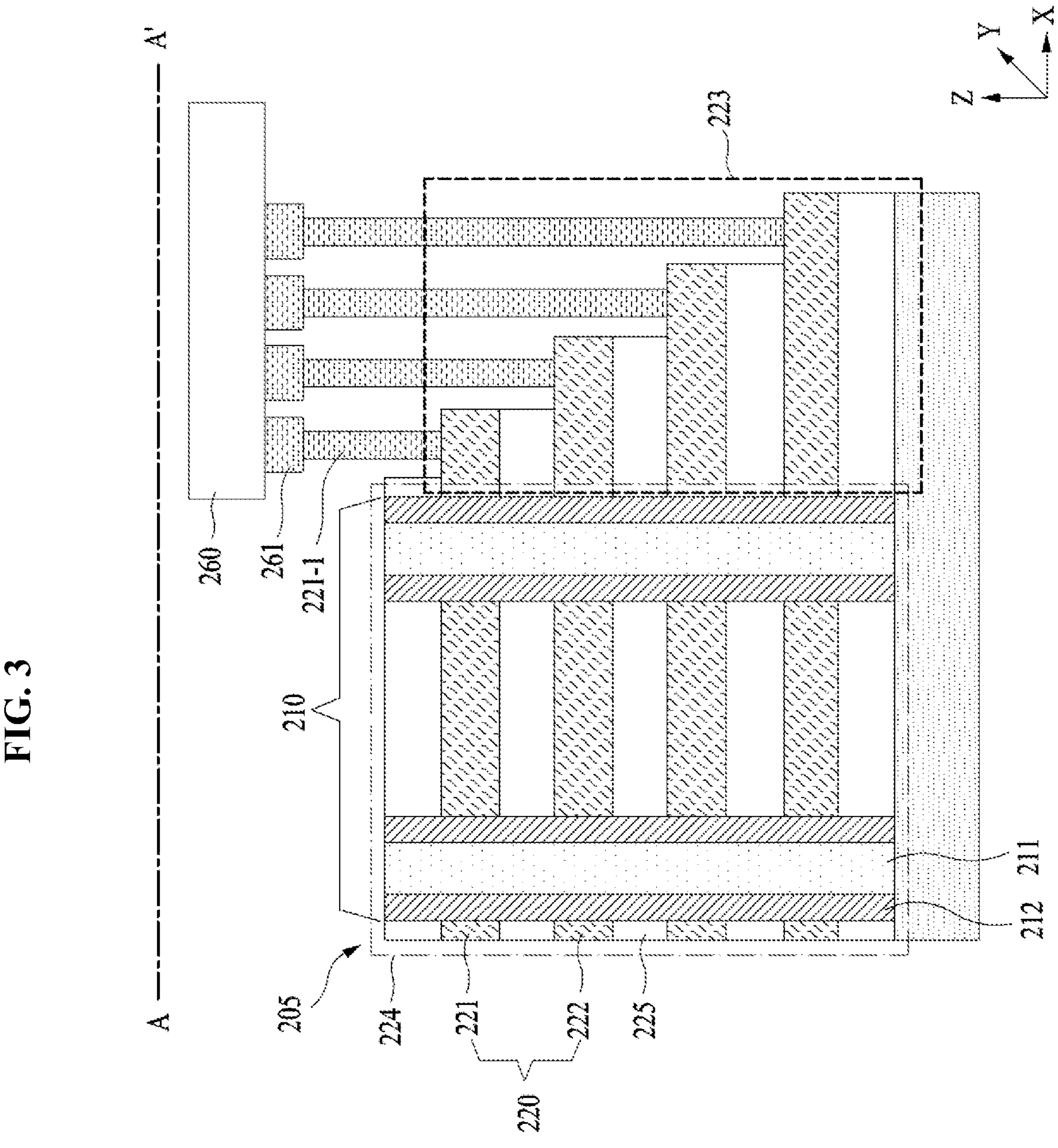
FIG. 3 is an X-Z cross-sectional view illustrating a conventional 3D flash memory taken along axis A-A' illustrated in FIG. 2.

Hereinafter, embodiments will be described in detail with reference to the accompanying drawings. However, the present disclosure is not limited or restricted by the embodiments. Further, the same reference signs/numerals in the drawings denote the same members.

Furthermore, the terminology used herein are used to properly express the embodiments of the present disclosure, and may be changed according to the intentions of the user or the manager or the custom in the field to which the present disclosure pertains. Accordingly, definition of the terms should be made according to the overall disclosure set forth herein.

Figure 4:
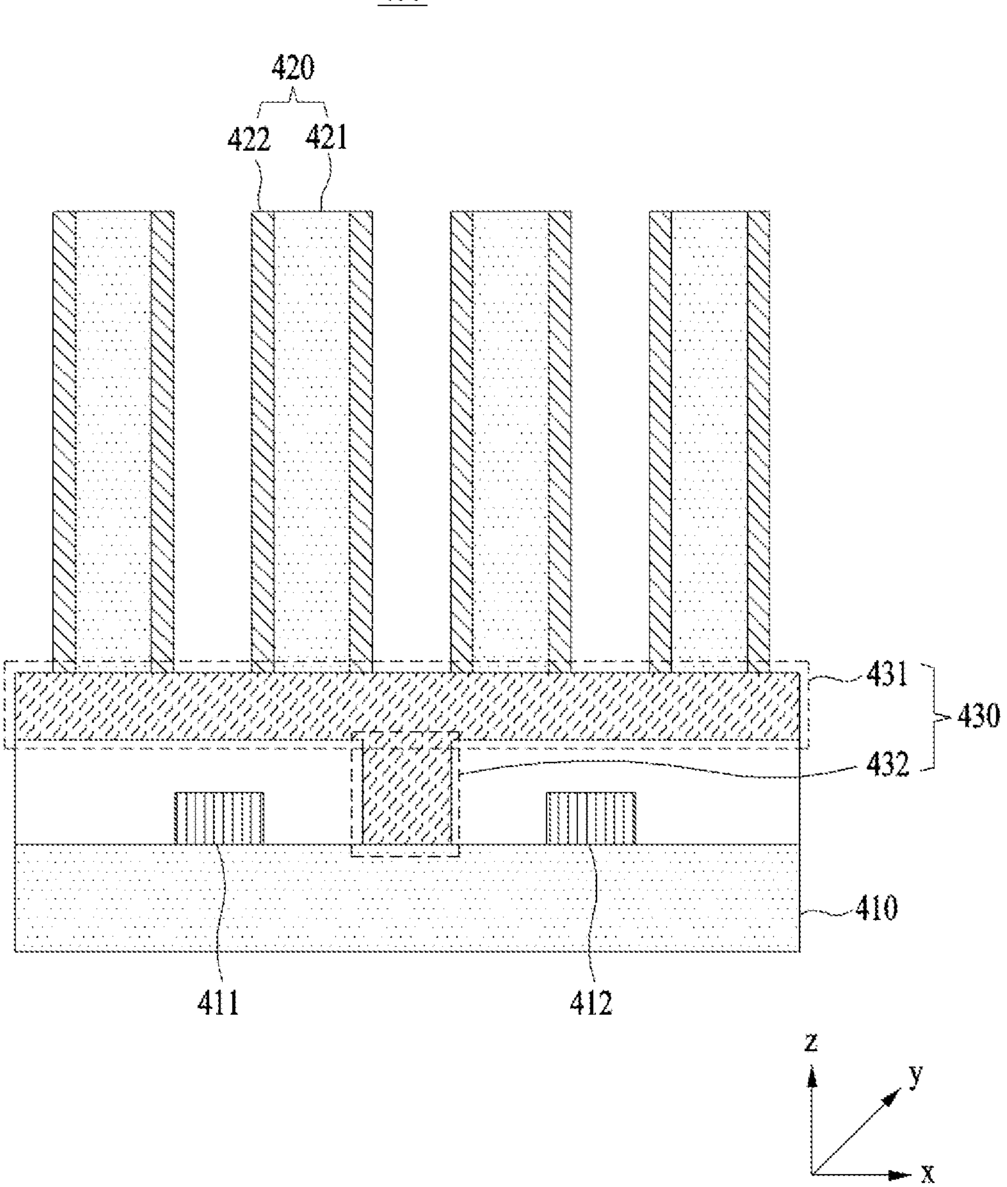
FIG. 4 is an X-Z cross sectional view illustrating a conventional 3D flash memory according to an embodiment.

FIG. 4 is an X-Z cross-sectional view illustrating a 3D flash memory according to an embodiment.

Referring to FIG. 4, a 3D flash memory 400 according to an embodiment includes a substrate 410, at least one memory cell string 420, and a common source line 430.

The substrate 410 may include at least one transistor 411 or 412 of a peripheral circuit, based on a COP structure, and may include single crystalline silicon or polycrystalline silicon.

At least one memory cell string 420 may include at least one channel layer 421 and at least one charge storage layer 422 to surround the at least one channel layer 421, while including a drain line (not illustrated) extending in one direction (for example, the Z direction) from an upper portion of at least one transistor 411 or 412 of the peripheral circuit and disposed at the upper portion thereof. The at least one channel layer 421 may include single crystalline silicon or polycrystalline silicon, and the at least one charge storage layer 422, which is a component to store charges based on a current introduced through a plurality of electrode layers (not illustrates), may be formed in, for example, an oxide-nitride-oxide (ONO) structure. Although the following description will be made while focusing on that the at least one charge storage layer 422 includes only a vertical component extending in one direction (for example, the Z direction) perpendicular to the substrate 410, the present disclosure is not limited thereto. In addition, the at least one charge storage layer 422 may further include a horizontal component provided in parallel to the substrate 410 and making contact with a plurality of electrodes.

In this case, the plurality of electrode layers, which are not illustrated in the drawing, may include a conductive material, such as tungsten (W), titanium (Ti), tantalium (Ta), copper (Cu), or gold (Au), which is the same as a material of the plurality of electrode layers 130 included in the conventional 3D flash memory 100 illustrated in FIG. 1 to perform a wordline function. Similarly, as a plurality of insulating layers (not illustrated) are formed of various materials, which represent an insulating characteristic, between the plurality of electrodes and alternately interposed between the plurality of electrode layers.

The common source line 430 is commonly used by at least one transistor 411 and 412 of the peripheral circuit and at least one memory cell string 420, and may be configured to include at least one horizontal part 431 and at least one vertical part 432. For example, the common source line 430 may include at least one horizontal part 431 positioned in parallel to the substrate 410, and at least one vertical part 432 positioned perpendicular to the substrate 410 in the space between at least one transistor 411 and 412 of the peripheral circuit.

The at least one horizontal part 431 and the at least one vertical part 432 of the common source line 430, which have the above structure, may be formed in the integral type through a single process. In other words, the at least one horizontal part 431 and the at least one vertical part 432 of the common source line 430 are formed through the single process to have an integral structure.

In this case, the at least one horizontal part 431 and the at least one vertical part 432 of the common source line 430 may be formed of the same material (for example, a conductive material, such as tungsten (W), titanium (Ti), tantalium (Ta), copper (Cu), or gold (Au)), such that the at least one horizontal part 431 is connected to the at least one memory cell string 420, and the at least one vertical part 432 is connected to the at least one transistor 411 and 412 of the peripheral circuit. Accordingly, the common source line 430 may be electrically connected to the at least one memory cell string 420 and the at least one transistor 411 and 412 of the peripheral circuit. In the following description, that the at least one horizontal part 431 is connected to the at least one memory cell string 420 may refer to that the at least one horizontal part 431 directly makes contact with the at least one memory cell string 420 or may be indirectly connected to the at least one memory cell string 420 through another component. Similarly, that the at least one vertical part 431 is connected to the at least one transistor 411 or 412 of the peripheral circuit may refer to the at least one vertical part 432 may directly make contact with the at least one transistor 411 or 412 of the peripheral circuit or may be indirectly connected to another component.

In addition, the at least one horizontal part 431 of the common source line 430 may be formed with an area corresponding to an area in which the at least one memory cell string 420 is formed. For example, the at least one horizontal part 431 of the common source line 430 has to be used as a source line with respect to the entire portion of the at least one memory cell string 420. Accordingly, the at least one horizontal part 431 of the common source line 430 may be formed with an area equal to or larger than the entire portion of the lower portion of the at least one memory cell string 420, to meet the entire lower portion of the at least one memory cell string 420. Accordingly, the at least one horizontal part 431 of the common source line 430 may be interposed between the at least one transistor 411 or 412 of the peripheral circuit and the at least one memory cell string 420.

In addition, the at least one vertical part 432 of the common source line 430 may be formed based on the arrangement position of the at least one transistor 411 and 412 of the peripheral circuit. For example, since the at least one vertical part 432 of the common source line 430 is connected to the at least one transistor 411 and 412 of the peripheral circuit. Accordingly, the at least one vertical part 432 of the common source line 430 may be formed to be positioned between the at least one transistor 411 or 412 of the peripheral circuit, by considering the position at which the at least one transistor 411 or 412 is disposed on the substrate 410.

As described above, according to an embodiment, the 3D flash memory 400 includes a common source line commonly used by the at least one transistor 411 or 412 of the peripheral circuit and the at least one memory cell string 420. Accordingly, the manufacturing costs may be reduced, the layout design may be simplified, and the area may be effectively used in the layout design.

The above detailed description of the manufacturing process of the 3D flash memory 400 will be made with reference to FIGS. 5, and 6A to 6C.

Figure 6A:
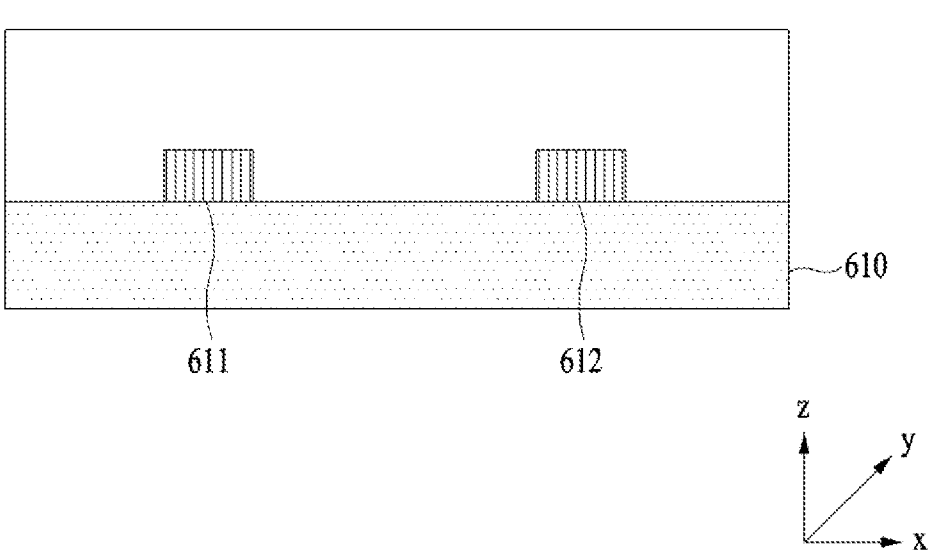
FIGS. 6A to 6C are X-Z cross-sectional views illustrating a method for manufacturing a 3D flash memory according to an embodiment.
Figure 6B:
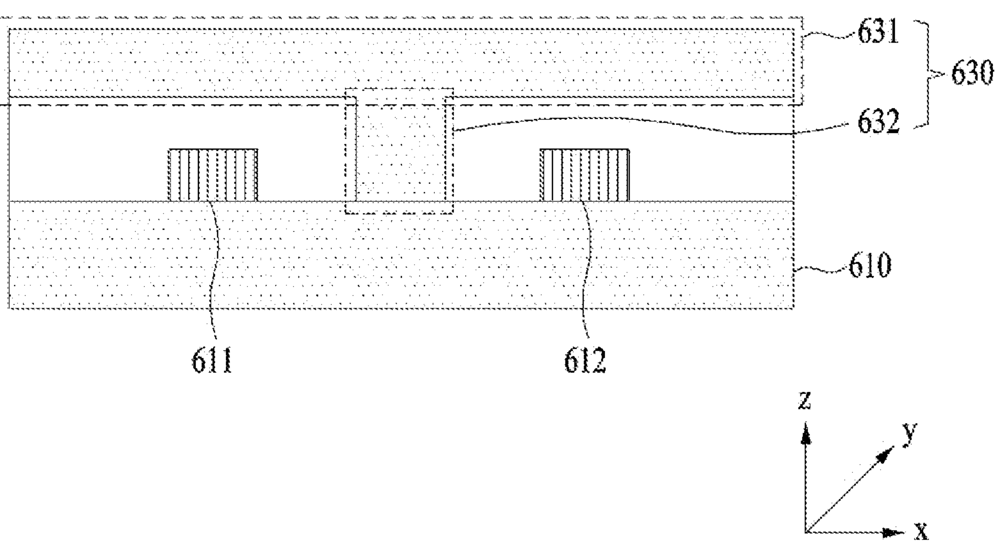
Figure 6C:
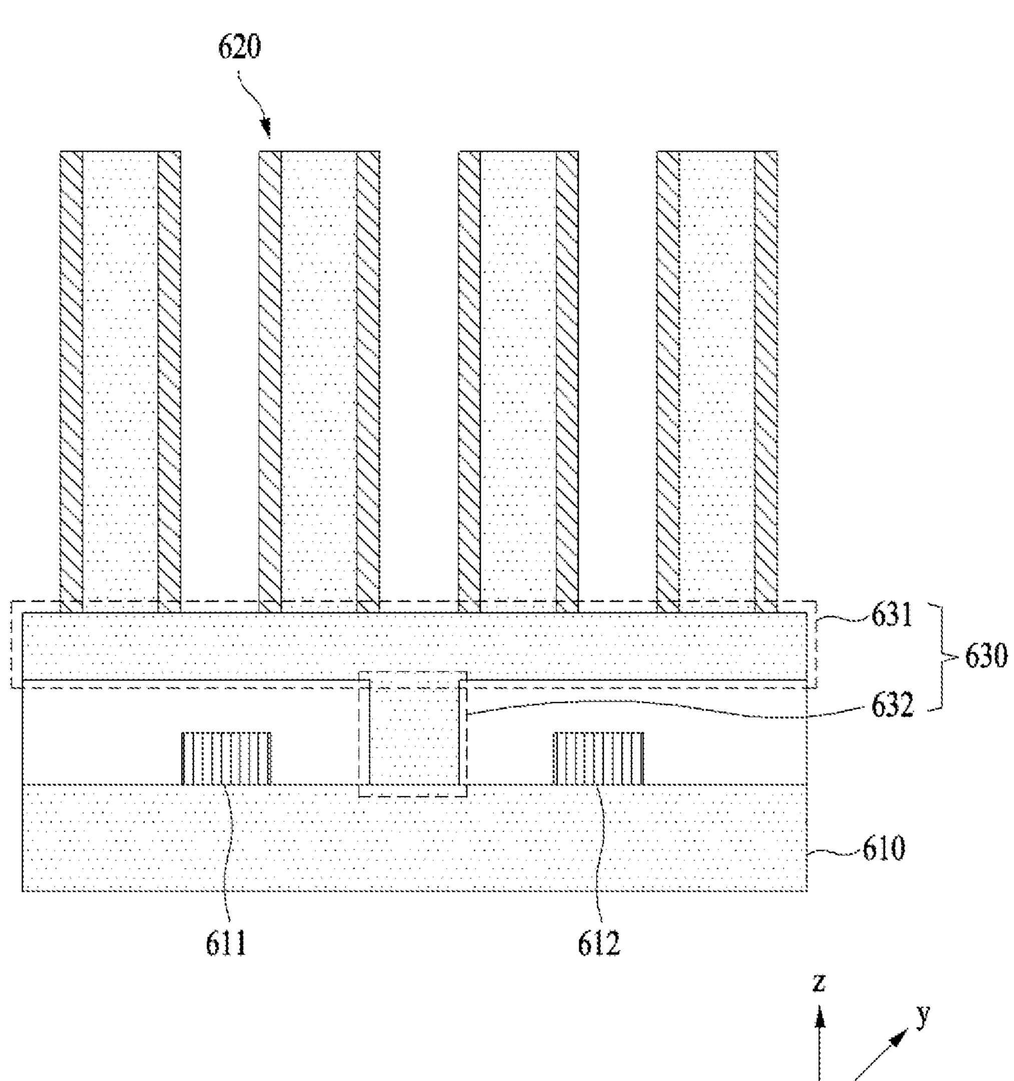

FIG. 5 is a flowchart illustrating a method for manufacturing a 3D flash memory according to an embodiment, and FIGS. 6A to 6C are an X-Z sectional view illustrating a method for manufacturing the 3D flash memory according to an embodiment. The manufacturing method to be described with reference to FIG. 5 and FIGS. 6A to 6C is to manufacture a 3D flash memory 400 described with reference to FIG. 4, and it is assumed that the 3D flash memory 400 is manufactured by an automated or mechanized manufacturing system.

Referring to FIG. 5 and FIGS. 6A to 6C, the manufacturing system according to an embodiment prepares a substrate 610 including at least one transistor 611 or 612 of a peripheral circuit based on a COP structure as illustrated in FIG. 6A in step S510.

Thereafter, the manufacturing system forms a common source line 630 to be commonly used by at least one transistor 611 or 612 of the peripheral circuit and at least one memory cell string 620 to be positioned above the at least one transistor 611 or 612, in step S520.

The manufacturing system may form the common source line 630 including at least one horizontal part 631 and at least one vertical part 632, such that the common source line 630 may be commonly used by the at least one transistor 611 or 612 and the at least one memory cell string 620.

In more detail, the manufacturing system may form the at least one horizontal part 631 and the at least one vertical part 632, such that the at least one horizontal part 631 is connected to the at least one memory cell string 620, and the at least one vertical part 632 is connected to the at least one transistor 5611 or 612 of the peripheral circuit.

In particular, the manufacturing system may be formed in an integral type through a single process, when forming the at least one horizontal part 631 and the at least one vertical part 632. For example, the manufacturing system may integrally form the at least one horizontal part 631 and the at least one vertical part 632 of the common source line 630 through the single process by using the same material (for example, a conductive material such as tungsten (W), titanium (Ti), tantallium (Ta), copper (Cu), or gold (Au), as illustrated in FIGS. 6B to 6C.

In this case, the manufacturing system may form the at least one horizontal part 631 of the common source line 630 to have an area corresponding to an area in which the at least one memory cell string 620 is formed. For example, the at least one horizontal part 631 of the common source line 630 should be used as a source line through the entire portion of the at least one memory cell string 620. Accordingly, the manufacturing system may form at least one horizontal part 631 of the common source lie 630 to have an area equal to or greater than an area of the entire lower portion of the at least one memory cell string 620, such that the at least one horizontal part 631 meet the entire lower portion of the at least one memory cell string 620.

In addition, the manufacturing system may from the at least one vertical part 632 of the common source line 630, based on the arrangement position of the at least one transistor 611 or 612 of the peripheral circuit. For example, since the at least one vertical part 632 of the common source line 630 is connected to the at least one transistor 611 or 612 of the peripheral circuit, the manufacturing system may form the at least one vertical part 632 such that the at least one vertical part 632 of the common source line 630 is positioned in the space between the at least one transistor 611 or 612 of the peripheral circuit, by considering the position in which the at least one transistor 611 or 612 of the peripheral circuit is disposed on the substrate 610.

Next, the manufacturing system forms at least one memory cell string 620 above the common source line 630 while extending the at least one memory cell string 620 in one direction as illustrated in FIG. 6C, in step S530.

In this case, the manufacturing system may form a plurality of electrode layers (not illustrated) stacked on at least one memory cell string 620 in a vertical direction and a plurality of insulating layers (not illustrated) alternately interposed between the plurality of electrode layers.

Figure 7:
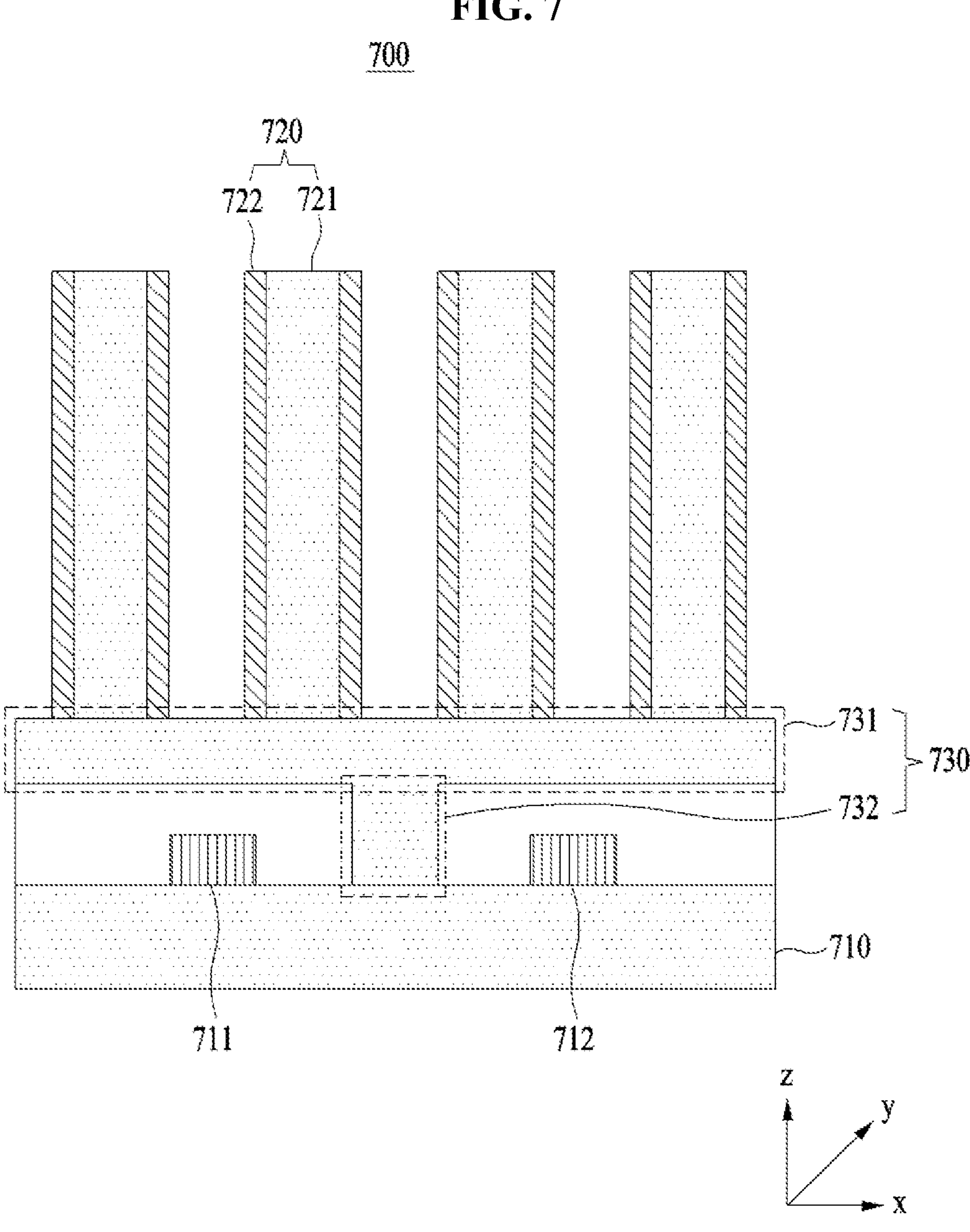
FIG. 7 is an X-Z cross sectional view illustrating a 3D flash memory according to an embodiment.

FIG. 7 is an X-Z cross-sectional view illustrating a 3D flash memory according to an embodiment.

Referring to FIG. 7, according to an embodiment, a 3D flash memory 700 includes a substrate 710, at least one memory cell string 720, and a connection part 730.

The substrate 710 may has at least one transistor 711 or 712 of a peripheral circuit formed on the substrate 710 based on the COS structure, and may be formed of silicon crystal silicon such that a bulk erasing voltage applied through the P+ contact (not illustrated) is transferred to the at least one memory cell string 720 through the connection part 730 In other words, the substrate 710 may include a silicon substrate. Hereinafter, although the drawing illustrates that only at least one transistor 711 or 712 is formed on the substrate 710, the present disclosure is not limited thereto. Lines, such as a source line and a drain line, used by the at least one transistor 711 or 712 may be further formed. However, a line may be omitted in the drawing for the illustrative purpose.

At least one memory cell string 720 may include at least one channel layer 721 and at least one charge storage layer 722 to surround the at least one channel layer 721, while including a drain line (not illustrating) extending in one direction (for example, the Z direction) from an upper portion of at least one transistor 711 or 712 of a peripheral circuit and disposed at the upper portion thereof. The at least one channel layer 721 may include single crystalline silicon or polycrystalline silicon, and the at least one charge storage layer 722, which is a component to store charges based on a current introduced through a plurality of electrode layers (not illustrates) and may be formed in, for example, an oxide-nitride-oxide (ONO) structure. Hereinafter, although the description will be made in that at least one charge storage layer 722 includes only a vertical element extending in one direction perpendicular to the substrate 710, the present disclosure is not limited thereto. In other words, the at least one charge storage layer 722 may further include a horizontal element making contact with a plurality of electrode layers.

Hereinafter, a plurality of electrode layers, which are not illustrated in drawings, may be formed of a conductive material, such as W, Ti, Ta, Cu, or Au, which is similarly to a plurality of electrode layers 130 included in an existing 3D flash memory 100 illustrated in FIG. 1 to perform a wordline function. Similarly, as a plurality of insulating layers (not illustrated) are formed of various materials, which represent an insulating characteristic, between the plurality of electrodes and alternately interposed between the plurality of electrode layers.

The connection part 730 may connect the substrate 710 to the at least one memory cell string 720, thereby transmitting a bulk erasing voltage applied to the substrate 710 to at least one memory cell string 720.

To this end, the connection part 730 may be formed of single crystalline silicon, which is the same as a material for forming the substrate 710, and may include at least one horizontal part 731, which is positioned to be parallel to the substrate 710 between an upper portion of the at least one transistor 711 or 712 of the peripheral circuit and a lower portion of at least one memory cell string 720, and at least one vertical part 732 positioned perpendicularly to the substrate 710 in a space between the at least one transistor 711 or 712 of the peripheral circuit.

The at least one horizontal part 731 and the at least one vertical part 732 of the connection part 730, which have the above structure, may be formed in the integral type through an epitaxial growing process. In other words, the at least one horizontal part 731 and the at least one vertical part 732 of the connection part 730 are formed through the single epitaxial growing process, thereby forming an integral type structure.

In this case, the at least one horizontal part 731 of the connection part 730 may be formed with an area corresponding to an area in which at least one memory cell string 720 is formed and an area in which at least one transistor 711 and 712 of the peripheral circuit are formed. For example, at least one horizontal part 731 of the connection part 730 needs to transmit the bulk erasing voltage applied to the substrate 710 to the entire portion of the at least one memory cell string 720. Accordingly, the at least one horizontal part 731 of the connection part 730 may be formed with an area the same as or larger than an area of the entire lower portion of the at least one memory cell string 720, such that the at least one horizontal part 731 of the connection part 730 meets the entire lower portion of the at least one memory cell string 720. For another example, the at least one horizontal part 731 of the connection part 730 may be formed with an area the same as or larger than an area of the entire upper portion of the at least one transistor 711 or 712 of the peripheral circuit to cover the entire upper portion of the at least one transistor 711 or 712 of the peripheral circuit.

In addition, the at least one vertical part 732 of the connection part 730 may be formed based on the arrangement position of the at least one transistor 711 and 712 of the peripheral circuit. For example, the at least one vertical part 732 of the connection part 730 is positioned in the space between the at least one transistor 711 or 712 of the peripheral circuit. Accordingly, the at least one vertical part 732 of the connection part 730 may be formed to be positioned between the at least one transistor 711 or 712 of the peripheral circuit, by considering the position in which the at least one transistor 711 or 712 of the peripheral circuit is disposed on the substrate 710.

In addition, the connection part 730 may be formed of a single crystalline silicon to transmit the bulk erasing voltage applied from the substrate 710 to at least one memory cell string 720. In addition, the connection part 730 may further include a terminal to transmit the bulk erasing voltage to the at least one memory cell string 720.

As described above, according to an embodiment, the 3D flash memory 700 may include the connection part 730 to connect the substrate 710 to the at least one memory cell string 720, thereby exhibiting a technical effect for supporting the bulk erasing operation in the COP structure. In addition, the 3D flash memory 700 may exhibit the technical effect of simplifying the manufacturing process, as the connection part 730 includes the at least one horizontal part 731 and the at least one vertical part 732 which are integrally formed through a single epitaxial growing process. In addition, the 3D flash memory 700 may exhibit the technical effect of simplifying the metal interconnect process, because an additional line may be omitted to transmit the bulk erasing voltage, as the substrate 710 and the connection part 730 are formed of single crystalline silicon.

The above detailed description of the manufacturing process of the 3D flash memory 700 will be made with reference to FIGS. 8, and 9A to 6D.

Figure 8:
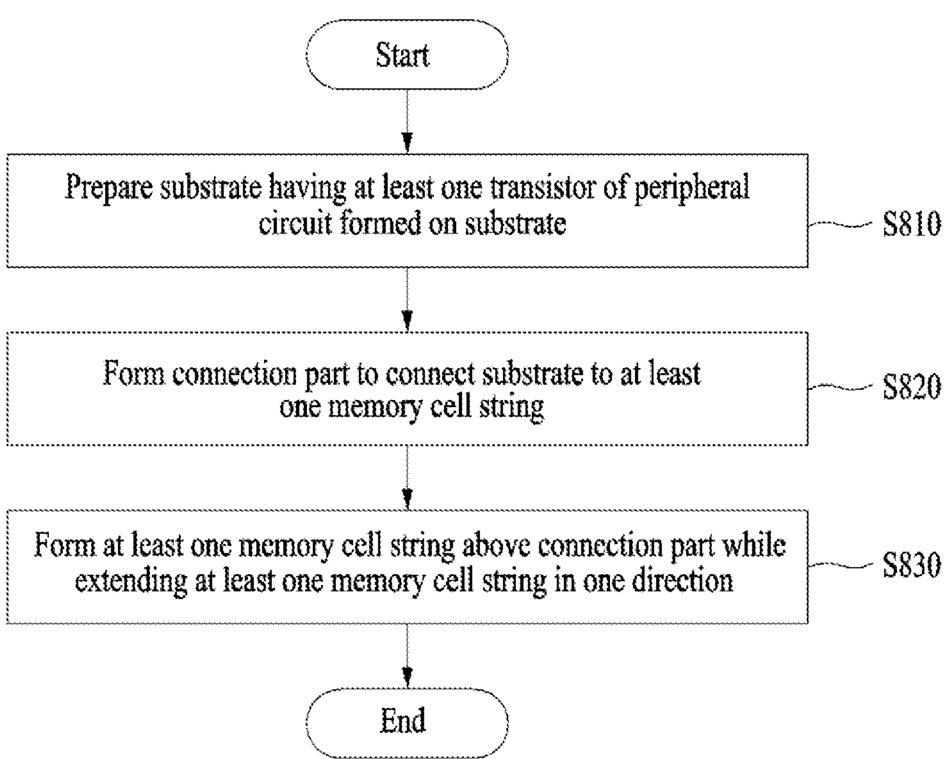
FIG. 8 is a flowchart illustrating a method for manufacturing a 3D flash memory according to an embodiment.

FIG. 8 is a flowchart illustrating a method for manufacturing a 3D flash memory, according to an embodiment, and FIGS. 9A to 9D are X-Z sectional views illustrating a method for manufacturing a 3D flash memory, according to an embodiment. Hereinafter, the manufacturing method to be described with reference to FIG. 8 and FIGS. 9A to 9D is to manufacture a 3D flash memory 700 described with reference to FIG. 7, and it is assumed that the 3D flash memory 700 is manufactured by an automated or mechanized manufacturing system.

Figure 9A:
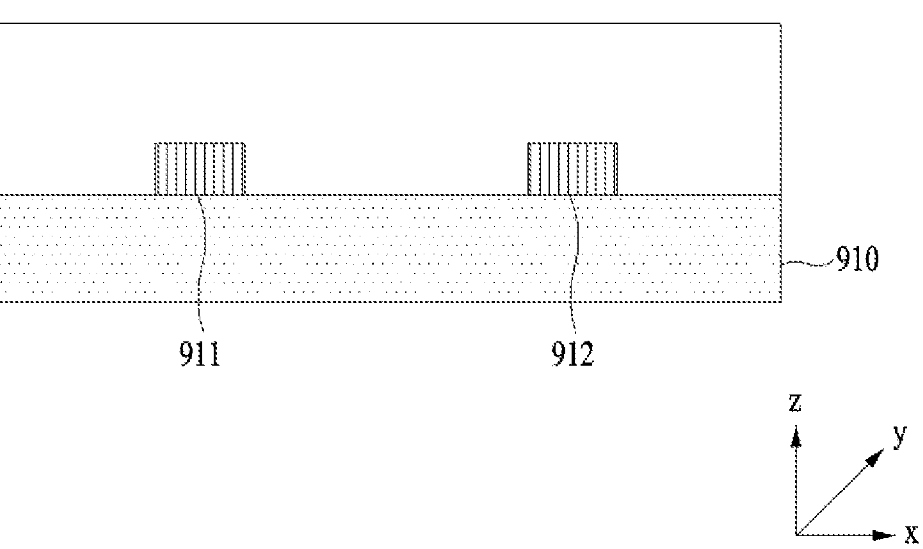
FIGS. 9A to 9D are X-Z cross-sectional views illustrating a method for manufacturing a 3D flash memory according to an embodiment.

Referring to FIGS. 8 and 9A to 9D, in step S810, the manufacturing system according to an embodiment prepares a substrate 910 having at least one transistor 911 and 912 of a peripheral circuit formed on the substrate 910 in a COP structure as illustrated in FIG. 9A, in step S810. In this case, the manufacturing system may prepare a substrate 910 formed of single crystalline silicon.

Figure 9B:
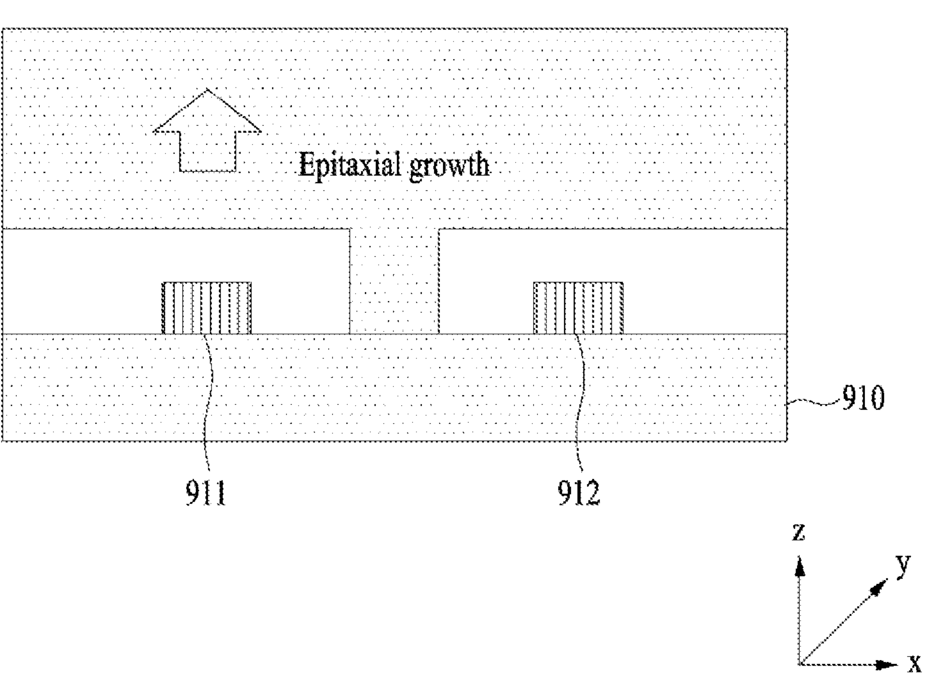
Figure 9C:
Figure 9C:
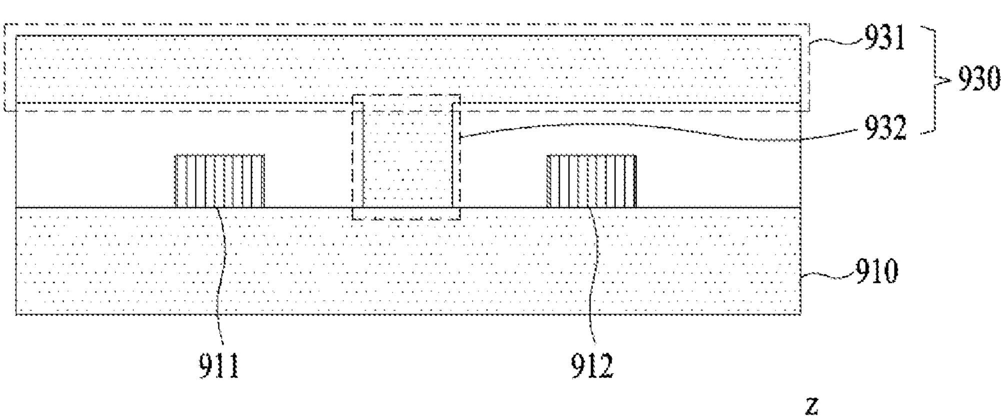

Thereafter, the manufacturing system forms a connection part 930 to connect a substrate 910 to at least one memory cell string 920 to be positioned above at least one transistor 911 or 912, as illustrated in FIGS. 9B to 9C.

In step S820, the connection part 930 is formed to connect the substrate 910 to the at least one memory cell string 920 to be positioned above at least one transistor 911 or 912. Accordingly, in step S820, the connection part 930 may be formed to perform a function of transmitting the bulk erasing voltage applied to the substrate 910 to the at least one memory string 920.

As described above, the manufacturing system may form the connection part 930 by using single crystalline silicon which is a material the same as a material for forming the substrate 910, such that the connection part 930 transmits the bulk erasing voltage applied to the substrate 910 to the at least one memory string 920.

In more detail, the manufacturing system may form a connection part 930 by forming the at least one horizontal part 931, which is positioned to be parallel to the substrate 910 between an upper portion of the at least one transistor 911 or 912 of the peripheral circuit and a lower portion of at least one memory cell string 920, and may include at least one vertical part 932 positioned perpendicularly to the substrate 910 in a space between the at least one transistor 911 or 912 of the peripheral circuit, such that the connection part 930 transmits the bulk erasing voltage applied to the substrate 910 to the at least one memory string 920.

In particular, the manufacturing system may form at least one horizontal part 931 and at least one vertical part 911 or 912 in an integral form through a single epitaxial growing process. For example, the manufacturing system may integrally form at least one horizontal part 931 and at least one vertical part 911 or 912 of the connection part 930, by performing an epitaxial growing process as illustrated in FIG. 9B, and then performing a planarization process through a chemical mechanical polishing process (CMP) as illustrated in FIG. 9C.

In this case, the manufacturing system may form at least one horizontal part 931 of the connection part 930 to have an area corresponding to an area for forming the at least one memory cell string 920 and an area for forming the at least one transistor 911 or 912 of a peripheral circuit. For example, the at least one horizontal part 931 of the connection part 930 has to transmit a bulk erasing voltage, which is applied to the substrate 910, to an entire portion of at least one memory cell string 920. Accordingly, the manufacturing system may form at least one horizontal part 931 of the connection part 930 to have an area equal to or greater than an area of an entire lower portion of at least one memory cell string 920 such that the at least one horizontal part 931 meets the entire portion of the at least one memory cell string 920 For another example, the manufacturing system may form the at least one horizontal part 931 of the connection part 930 to have an area equal to or larger than an area of the entire upper portion of the at least one transistor 911 or 912 of the peripheral circuit such that at least one horizontal part 931 of the connection part 930 covers the entire upper portion of the at least one transistor 911 or 912 of the peripheral circuit.

In addition, the manufacturing system may from the at least one vertical part 932 of the connection part 930, based on the position for disposing the at least one transistor 911 or 912. For example, the at least one vertical part 932 of the connection part 930 has to be positioned in the space between the at least one transistor 911 or 912 of the peripheral circuit. Accordingly, the manufacturing system may form the at least one vertical part 932 of the connection part 930 to be positioned between the at least one transistor 911 or 912 of the peripheral circuit, by considering the position in which the at least one transistor 911 or 912 of the peripheral circuit is disposed on the substrate 910.

In addition, the manufacturing system may form the connection part 930 using single crystalline silicon to transmit the bulk erasing voltage applied from the substrate 910 to at least one memory cell string 920. In addition, the connection part 730 may further include a terminal to transmit the bulk erasing voltage to the at least one memory cell string 920.

Figure 9D:
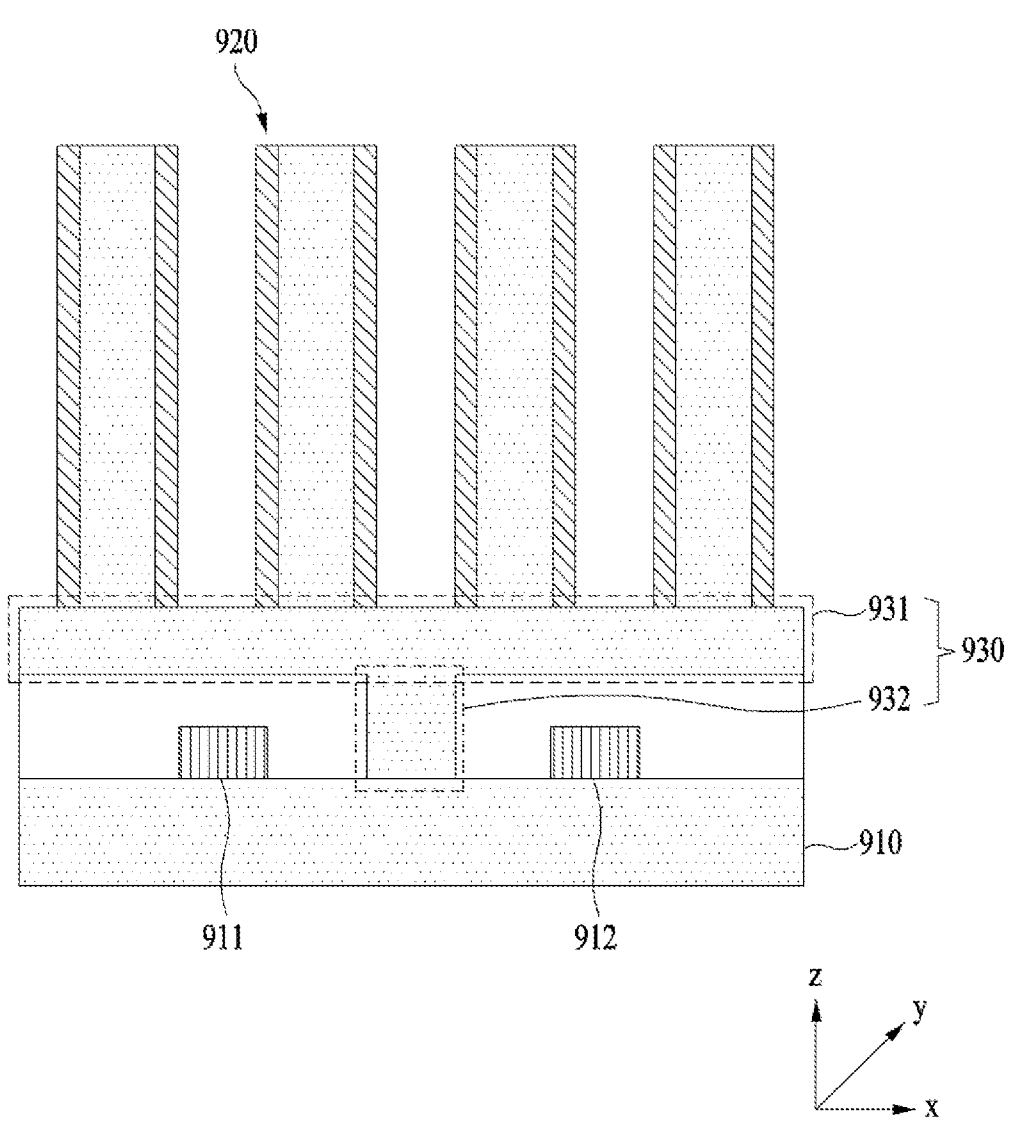

Next, the manufacturing system may from at least one memory cell string 920 on the connection part 930 as illustrated in FIG. 9D in step S830.

In this case, the manufacturing system may form a plurality of electrode layers (not illustrated) stacked on at least one memory cell string 920 in a vertical direction and a plurality of insulating layers (not illustrated) alternately interposed between the plurality of electrode layers.

Figure 10:
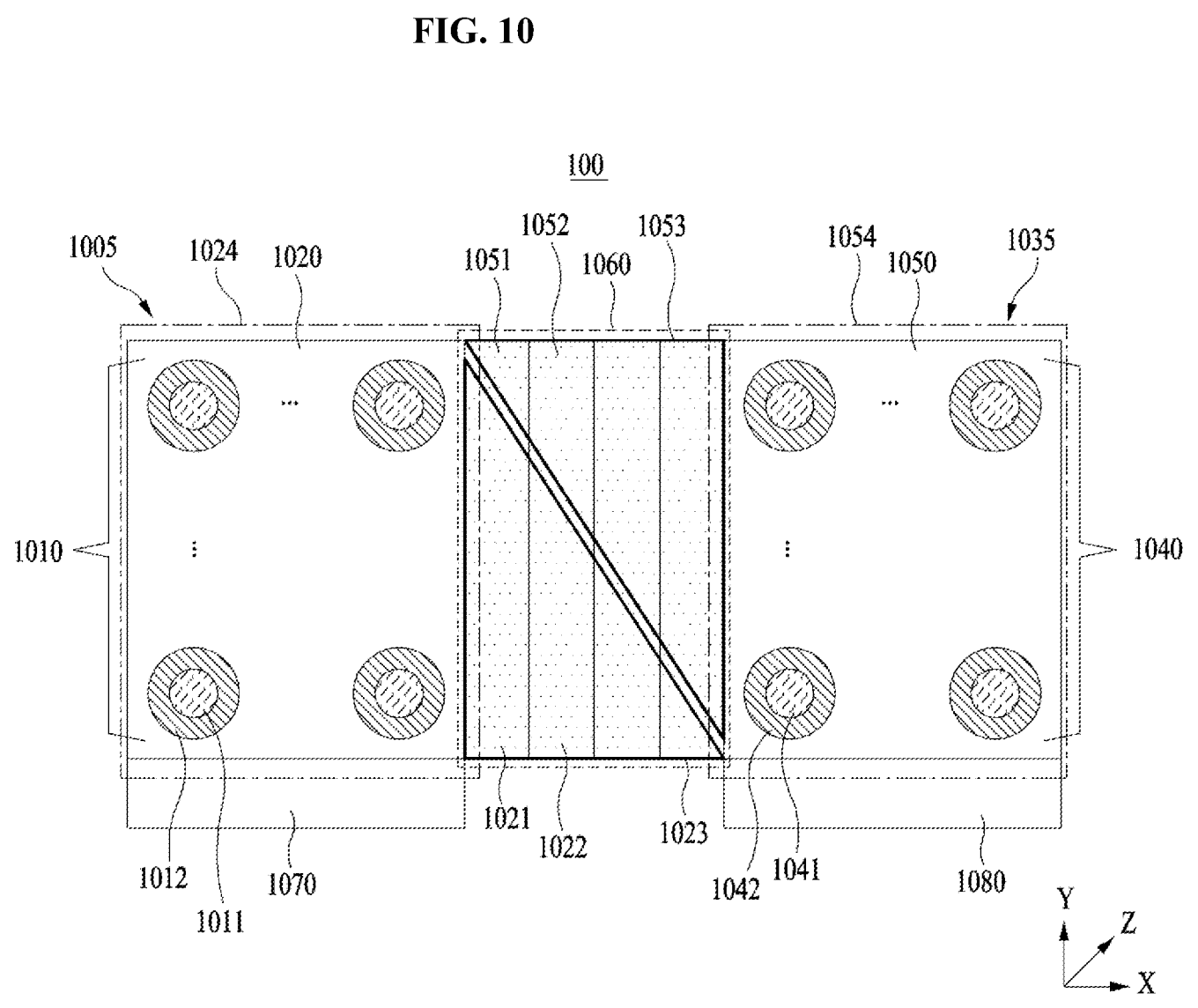
Figure 11:
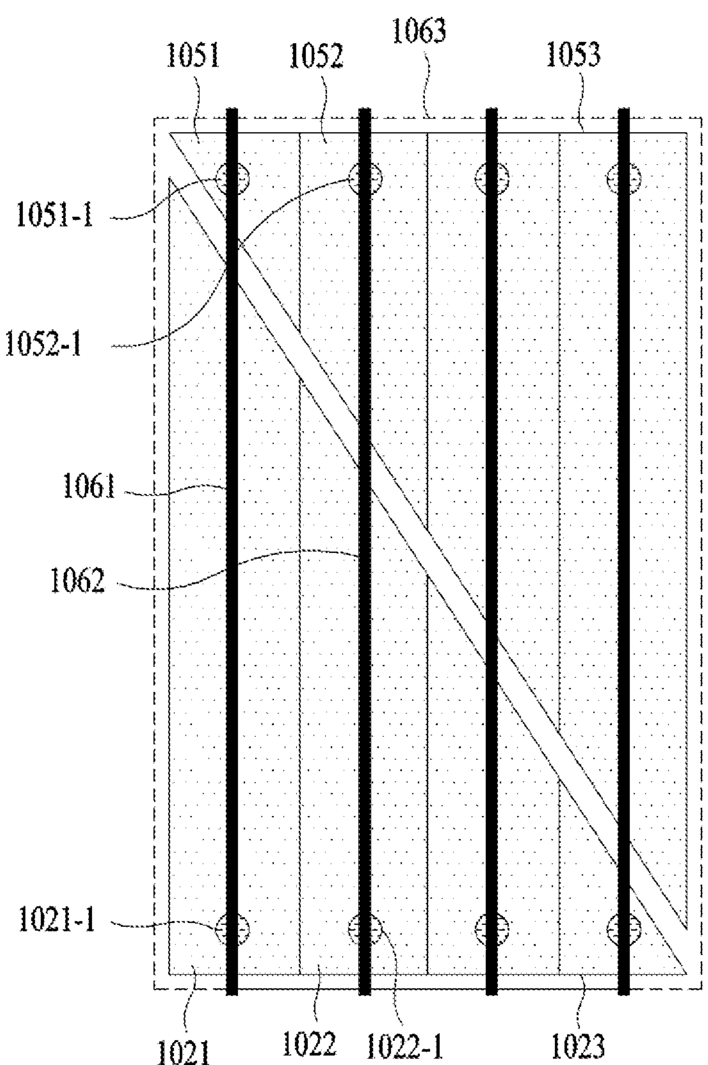
FIG. 11 is an enlarged X-Y plan view illustrating a region of a step part of first wordlines and a step part of second wordlines illustrated in FIG. 10.
Figure 11:
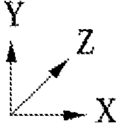

FIG. 10 is an X-Y plan view illustrating a 3D flash memory according to an embodiment, and FIG. 11 is an X-Y plan view obtained by enlarging a step part of first wordlines and a step part of second wordlines illustrated in FIGS. 11 and 10. Hereinafter, a row decoder 1060 is marked in a dotted line as illustrated in FIG. 10, even though the row decoder 1060 is positioned on a step part 1023 of a first memory cell array 1005 and a step part 1053 of a second memory cell array 1035. In addition, the row decoder 1060 is not illustrated in FIG. 4 for the illustrative purpose, and only wordline control lines 1061 and 1062 included in the row decoder 1060 are illustrated in FIG. 4.

Referring to FIGS. 10 and 11, according to an embodiment, a 3D flash memory 1000 may include a first memory cell array 1005, a second memory cell array 1035, a row decoder 1060, and two column decoders 1070 and 1080.

In more detail, the first memory cell array 1005 may be configured to include at least one first memory cell string 1010 extending in the vertical direction (the Z direction), and a plurality of first wordlines 1020 connected to the at least one first memory cell string 1010 perpendicularly to the at least one first memory cell string 1010 and stacked while extending in a horizontal direction (the X direction). The second memory cell array 1035 may be configured to include at least one second memory cell string 1040 formed to extend in the vertical direction (the Z direction), and a plurality of second wordlines 1050 connected to at least one second memory cell string 1040 perpendicularly to the at least one second memory cell string 240 and stacked while extending in the horizontal direction (the X direction).

Hereinafter, at least one first memory cell string 1010 is referred to as at least one memory cell string included in the first memory cell array 1005, and is expressed as "a first memory cell string" to distinguished from a memory cell string included in the second memory cell array 1035. Similarly, at least one second memory cell string 1040, which is referred to as at least one memory cell string included in the second memory cell array 1035, is expressed as "a second memory cell string" to be distinguished from a memory cell string included in the first memory cell array 1005.

The first wordlines 1020, which are referred to as a plurality of wordlines included in the first memory cell array 1005, is expressed as "first wordlines" to be distinguished from wordlines included in the second memory cell array 1035. The second wordlines 1050, which are referred to as a plurality of wordlines included in the second cell array 1035, is expressed as "second wordlines" to be distinguished from the wordlines included in the first memory cell array 1005.

In this case, each of the at least one first memory cell string 1010 or the at least one second memory cell string 1040 may include at least one channel layer 1011 or 1041 extending in the vertical direction (the Z direction) and at least one charge storage layer 1012 or 1042 formed to surround the at least one channel layer 1011 and 1041. A plurality of insulating layers (not illustrated) may be alternately interposed between the plurality of first wordlines 1020, and a plurality of second insulating layers (not illustrated) may be alternately interposed between the plurality of second wordlines 1050.

The at least one channel layer 1011 or 1041 may be formed of single crystalline silicon or polycrystalline silicon, and may be formed through a selective epitaxial growth process employing a substrate (not shown) as a seed, or a phase transition epitaxial process. In addition, the at least one channel layers 1011 or 1041 may be formed in a hollowed tube shape or may include a buried film (not illustrated) formed therein.

The at least one charge storage layer 1012 or 1042, which is a component having a memory function to store a charge from a current (for example, a current is introduced through first wordlines 1020 in the at least one charge storage layer 1012 of the first memory cell array 1005 and a current is introduced through second wordlines 1050 in at least one charge storage layer 1042 of the second memory cell array 1035) introduced through the wordlines 1020 or 1050, may be formed in, for example, an oxide-nitride-oxide (ONO) structure. Although the following description has been described while focusing on that the at least one charge storage layer 1012 or 1042 includes only a vertical component, the present disclosure is not restricted or limited. For example, the at least one charge storage layer 1012 or 1042 may further include a horizontal component.

In addition, although not illustrated, at least one tunneling insulating layer (not illustrated), which is formed to extend in the vertical direction while surrounding the at least one memory cell string 1010 or 1040, may be disposed outside at least one first memory cell string 1010 or at least one second memory cell string 1040. The at least one tunneling insulating layer may be made of an insulating material (for example, an insulating material such as $Al_2O_3$, $HfO_2$, $TiO_2$, $La_2O_5$, $BaZrO_3$, $Ta_2O_5$, $ZrO_2$, $Gd_2O_3$, or $Y_2O_3$) having a high dielectric constant (High-k) characteristics.

Each of a plurality of first wordlines 1020 and a plurality of second wordlines 1050 serves to apply voltage to at least one memory cell string 1010 and 1040 (for example, the first wordlines 1020 serve to apply a voltage to at least one first memory cell string 1010, and the second wordlines 1050 serves to apply a voltage to at least one second memory cell string 1040), and may be formed of a conductive material such as W, Ti, Ta, Cu, or Au. Each of the plurality of first insulating layers and the plurality of second insulating layers may be formed of an insulating material (for example, an insulating material, such as $Al_2O_3$, $HfO_2$, $TiO_2$, $La_2O_5$, $BaZrO_3$, $Ta_2O_5$, $ZrO_2$, $Gd_2O_3$, or $Y_2O_3$, having a high dielectric constant (High-k) characteristics.

In this case, the first wordlines 1020 may include a step part 1023 and a flat part 1024, as the wordlines 1021 or 1022 including the first wordlines 1020 extend with mutually different lengths. Similarly, the second wordlines 1050 may include a step part 1050 and the flat part 1054, as wordlines 1051 and 1052 constituting the second wordlines 1050 extend with mutually different lengths.

The row decoder 1060 may be formed between the first memory cell array 1005 and the second memory cell array 1035. In particular, the row decoder 1060 may be formed to simultaneously share the first memory cell array 1005 and the second memory cell array 1035 through mutually different contacts. In more detail, the wordline control lines 1061 and 1062 included in the row decoder 1060 are connected to a contact of any one step difference, of step differences constituting the step part of the first wordlines 1020 and a contact of any one step difference of step differences constituting the step part of the second wordlines 1050. Accordingly, the first memory cell array 100 5 and the second memory cell 1035 may be simultaneously shared through mutually different contacts.

For example, a first wordline control line 1061 of wordline control lines 1061 or 1062 of the row decoder 1060 is connected to a contact 1021-1 of a first step (the first step corresponds to a (1-1)-th wordline 1021 of steps constituting the step part 1023 of the first wordlines 1020) and a contact 1051-1 of the first step (the first step corresponds to a (2-1)-th wordline 1051) of steps constituting the step part 1053 of the second wordlines 1050, thereby sharing the first step 1021 of the first wordlines 1020 and the first step 1051 of the second wordlines 1050. Similarly, a second wordline control line 1062 of wordline control lines 1061 or 1062 of the row decoder 1060 is connected to a contact 1022-1 of a second step (the second step corresponds to a (2-1)-th wordline 1022 of steps constituting the step part 1023 of the first wordlines 1020) and a contact 1052-1 of the second step (the second step corresponds to a (2-2)-th wordline 1052) of steps constituting the step part 1023 of the first wordlines 1020, thereby sharing the second step of the first wordlines 1020 and the second step of the second wordlines 1050.

In other words, the step part 1023 of the first wordlines 1020 and the step part 1053 of the second wordlines 1050 correspond to wordlines 1021 and 1022 constituting the first wordlines 1020 and wordlines 1051 and 1052 constituting the second wordlines 1050, respectively. Accordingly, when the wordline control line 1061 and 1062 of the row decoder 1060 share the step part 1023 of the first wordlines 1020 and the step part 1053 of the second wordlines 1050, the wordline control lines 1061 and 1062 of the row decoder 1060 may share the first wordlines 1020 and the second wordlines 1050.

In this sharing structure, in the 3D flash memory 1000, the row decoder 1060 applies a bias to the first memory cell array 1005 and the second memory cell array 1035 through wordline control lines 1061 and 1062, respectively, and a bias is applied to any one memory cell array of the first memory cell array 1005 or the second memory cell array 1035 through any one column decoder of column decoders provided to correspond to the first memory cell array 1005 and the second memory cell array 1035, thereby selectively driving any one memory cell array of the first memory cell array 1005 or the second memory cell array 1035.

For the sharing structure, the step part 1023 of the first wordlines 1020 and the step part 1053 of the second wordlines 1050 may be formed in a triangular shape when viewed on a plan view, and may be disposed adjacent to each other in a rotational symmetry. While the step part 1023 of the first wordlines 1020 and the step part 1053 of the second wordlines 1050 may be formed in a triangular shape when viewed on a plan view, the step part 1023 of the first wordlines 1020 and the step part 1053 of the second wordlines 1050 are adjacent to each other in a rotational symmetry to form a rectangle shape 1063. In this case, the step part 1023 of the first wordlines 1020 and the step part 1053 of the second wordlines 1050 may be spaced apart from each other without making contact with each other, such that the step part 1023 and the step part 1053 are electrically insulated from each other, thereby forming one rectangle shape 1063 including separated triangles.

In this case, the step part 1023 of the first wordlines 1020 and the step part 1053 of the second wordlines 1050 are positioned below the row decoder 1060 provided between the memory cell arrays 1005 and 1035, thereby forming the rectangle shape 1063 with an area corresponding to an area of the decoder 1060, when viewed from a plan view.

As described above, the step part 1023 of the first wordlines 1020 and the step part 1053 of the second wordlines 1050 are formed, in a triangular shape, when viewed in a plan view, under the row decoder 1060 interposed between the memory cell arrays 1005 and 1035, and are adjacent to each other in a rotational symmetry to form a rectangle shape 1063. According to an embodiment, the 3D flash memory 1000 may reduce the area of the step part by ½ that of the conventional 3D flash memory, thereby achieving the integration. In addition, the number of the wordline control lines 1061 and 1062 of the row decoder 1060 connected to the contacts 1021-1, 1022-1, 1051-1, and 1052-1 formed at the step parts 1023 and 1053 of the memory cell arrays 1005 and 1035 is reduced to ½ of those of the conventional 3D flash memory, thereby simplifying a metal interconnection process and reducing the process costs.

The details of a method for manufacturing the 3D flash memory 1000 will be made with reference to FIG. 12 below.

Figure 12:
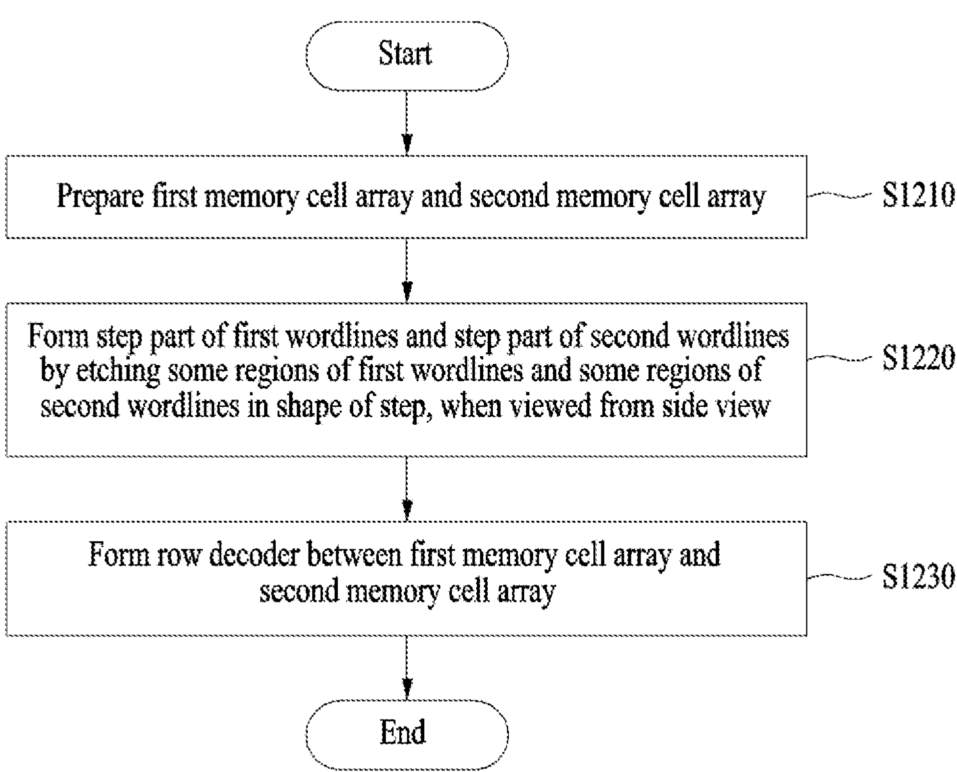
FIG. 12 is a flowchart illustrating a method for manufacturing a 3D flash memory according to an embodiment.

FIG. 12 is a flowchart illustrating a method of manufacturing a 3D flash memory according to an embodiment. Hereinafter, an automated or mechanized manufacturing system may be employed to perform the method for manufacturing the 3D flash memory, and the 3D flash memory manufactured through steps S1210 to S1230 described later has the structure described with reference to FIGS. 10 to 11.

Referring to FIG. 12, according to an embodiment, the manufacturing system may prepare the first memory cell array and the second memory cell array in step S1210.

In this case, the first memory cell array may be configured to include at least one first memory cell string extending in the vertical direction, and a plurality of first wordlines connected to the at least one first memory cell string perpendicularly to the at least one first memory cell string and stacked while extending in the horizontal direction (the X direction). The second memory cell array may be configured to include at least one second memory cell string formed to extend in the vertical direction (the Z direction), and a plurality of second wordlines connected to at least one second memory cell string perpendicularly to the at least one second memory cell string and stacked while extending in the horizontal direction (the X direction). However, the present disclosure is not limited. The first memory cell array may include a plurality of first insulating layers alternately interposed between a plurality of first wordlines, and the second memory cell array may include a plurality of second insulating layers alternately interposed between a plurality of second wordlines.

In particular, the step S1210 may be to prepare the first memory cell array and the second memory cell array which are disposed to be adjacent to each other in a rotational symmetry, in the state that some regions of the first wordlines and some regions of the second wordlines form the triangular shape when viewed in a plan view. In more detail, the manufacturing system may prepare and arrange the first memory cell array and the second memory cell array such that some regions of the first wordlines and some regions of the second wordlines are adjacent to each other in a rotational symmetry to form a rectangle shape.

In this case, the manufacturing system may prepare the first memory cell array and the second memory cell array disposed such that some regions of the first wordlines and some regions of the second wordlines are spaced apart from each other without making contact with each other.

In addition, the manufacturing system may prepare the first memory cell array and the second memory cell array to form a rectangle shape in which some regions of the first wordlines and some regions of the second wordlines form the rectangle shape having an area corresponding to an area of the row decoder (wherein the row decoder, which is a component formed in following step S1230, is a component to be positioned on a step part to be formed by etching the some region of the first wordlines and a step part to be formed by etching the some region of the second wordlines) when viewed in a plan view.

Then, the manufacturing system may form a step part of the first wordlines and a step part of the second wordlines by etching some regions of the first wordlines and some regions of the second wordlines in the shape of a step, when viewed from a side view, in step S1220. In this case, the manufacturing system simultaneously etches the some regions of the first wordlines and the some regions of the second wordlines through a single process, thereby simultaneously forming the step part of the first wordlines and the step part of the second wordlines.

Thereafter, the manufacturing system may form the row decoder between the first memory cell array and the second memory cell array in step S1230. In particular, the manufacturing system may form the row decoder such that the wordline control lines of the row decoder simultaneously share the first memory cell array and the second memory cell array through mutually different contacts. In detail, the manufacturing system may form the row decoder such that the wordline control lines of the row decoder are connected with a contact of any one step of steps constituting the step part of the first wordlines and a contact of any one step of the steps constituting the step part of the second wordlines, such that the wordline control lines of the row decoder simultaneously share the first memory cell array and the second memory cell array through mutually different contact.

As described above, to allow the wordline control lines of the row decoder to simultaneously share the first memory cell array and the second memory cell array through mutually different contacts (the wordline control lines of the row decoder are connected to a contact of any one step of steps constituting the step part of the first wordlines and a contact of any one step of steps constituting the step part of the second wordlines, some regions of the first wordlines and some regions of the second wordlines) may be possible, as the first memory cell array and the second memory cell array disposed to be adjacent to each other in a rotational symmetry in the state that some regions of the first wordlines and some regions of the second wordlines are formed in the triangular shape when viewed in a plan view in step S1210.

While embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

The invention claimed is:

1. A three-dimensional (3D) flash memory employing a cell on peripheral circuit (COP) structure, the 3D flash memory comprising:

a substrate comprising at least one transistor of a peripheral circuit formed based on the COP structure;

at least one memory cell string extending in a first direction from an upper portion of the at least one transistor; and a common source line in direct contact with the substrate and commonly used, as a source line, by each of the at least one transistor and the at least one memory cell string.

2. The 3D flash memory device of claim 1, wherein the common source line comprises:

at least one horizontal part and at least one vertical part, wherein the at least one horizontal part and the at least one vertical part are connected to the at least one transistor and the at least one memory cell string.

3. The 3D flash memory of claim 2, wherein the common source line includes the at least one horizontal part and the at least one vertical part integrally formed through a single process.

4. The 3D flash memory of claim 3, wherein the at least one horizontal part and the at least one vertical part comprise a same material.

5. The 3D flash memory of claim 2, wherein the at least one horizontal part is connected to the at least one memory cell string, and wherein the at least one vertical part is connected to the at least one transistor.

6. A 3D flash memory employing a cell on peripheral circuit (COP) structure, comprising:

a substrate comprising at least one transistor of a peripheral circuit formed based on the COP structure;

at least one memory cell string extending in a first direction from an upper portion of the at least one transistor; and a connection part comprising an epitaxial structure connected to the at least one memory cell string, the epitaxial structure being in direct contact with the substrate.

7. The 3D flash memory of claim 6, wherein the connection part is configured to apply a bulk erasing voltage to the substrate and the at least one memory cell string.

8. The 3D flash memory of claim 7, wherein the connection part comprises:

at least one horizontal part extending parallel to the substrate, between an upper portion of the at least one transistor and a lower portion of the at least one memory cell string; and at least one vertical part extending perpendicularly to the substrate, in a space in the at least one transistor.

9. The 3D flash memory of claim 8, wherein the epitaxial structure of the connection part includes the at least one horizontal part and the at least one vertical part integrally formed through an epitaxial growing process.

10. The 3D flash memory of claim 8, wherein an area of the at least one horizontal part corresponds to an area of the at least one memory cell string and an area of the at least one transistor.

11. A 3D flash memory for integration, comprising:

a first memory cell array comprising:

at least one first memory cell string extending in a vertical direction; and first wordlines connected to the at least one first memory cell string and extending in a horizontal direction perpendicularly to the at least one first memory cell string, wherein the first wordlines are stacked, extend with mutually different lengths, and respectively comprise a step part and a plan part;

a second memory cell array comprising:

at least one second memory cell string extending in the vertical direction; and second wordlines connected to the at least one second memory cell string and extending in the horizontal direction perpendicularly to the at least one second memory cell string, wherein the second wordlines are stacked, extend with mutually different lengths, and respectively comprise a step part and a plan part; and a row decoder between the first memory cell array and the second memory cell array, the row decoder comprising at least one wordline control line, wherein the at least one wordline control line is connected to the first memory cell array through a first contact, and is connected to the second memory cell array through a second contact.

12. The 3D flash memory of claim 11, wherein the at least one wordline control line comprises a plurality of wordline control lines, and each of the plurality of wordline control lines is connected with a contact of one step of steps constituting the step part of the first wordlines and a contact of one step of steps constituting the step part of the second wordlines.

13. The 3D flash memory of claim 11, wherein the step part of the first wordlines and the step part of the second wordlines are disposed to be adjacent to each other in a rotational symmetry, while forming a triangular shape when viewed in a plan view.

14. The 3D flash memory of claim 13, wherein the step part of the first wordlines and the step part of the second wordlines are adjacent to each other in a rotational symmetry to form a rectangular shape.

15. The 3D flash memory of claim 13, wherein the step part of the first wordlines and the step part of the second wordlines are positioned under the row decoder.

* * * * *